(12) United States Patent
Dussarrat et al.

(10) Patent No.: US 8,765,220 B2
(45) Date of Patent: Jul. 1, 2014

(54) METHODS OF MAKING AND DEPOSITION METHODS USING HAFNIUM- OR ZIRCONIUM-CONTAINING COMPOUNDS

(75) Inventors: Christian Dussarrat, Wilmington, DE (US); Vincent M. Omarjee, Grenoble (FR); Venkateswara R. Pallem, Hockessin, DE (US)

(73) Assignee: American Air Liquide, Inc., Fremont, CA (US)

( * ) Notice: Subject to any disclaimer, the term of this patent is extended or adjusted under 35 U.S.C. 154(b) by 82 days.

(21) Appl. No.: 13/501,057

(22) PCT Filed: Nov. 5, 2010

(86) PCT No.: PCT/US2010/055693
§ 371 (c)(1),
(2), (4) Date: Apr. 9, 2012

(87) PCT Pub. No.: WO2011/057114
PCT Pub. Date: May 12, 2011

(65) Prior Publication Data
US 2012/0207928 A1    Aug. 16, 2012

Related U.S. Application Data

(60) Provisional application No. 61/259,433, filed on Nov. 9, 2009.

(51) Int. Cl.
*C23C 16/28* (2006.01)
*C23C 16/40* (2006.01)

(52) U.S. Cl.
USPC ............. 427/255.29; 427/255.31; 427/255.36

(58) Field of Classification Search
USPC ............................ 427/255.29, 255.31, 255.36
See application file for complete search history.

(56) References Cited

U.S. PATENT DOCUMENTS

| | | | |
|---|---|---|---|
| 6,858,547 | B2 | 2/2005 | Metzner et al. |
| 6,969,539 | B2 * | 11/2005 | Gordon et al. ........... 427/255.29 |
| 2005/0056219 | A1 | 3/2005 | Dip et al. |
| 2007/0065578 | A1 | 3/2007 | McDougall |
| 2007/0259111 | A1 | 11/2007 | Singh et al. |
| 2008/0044569 | A1 | 2/2008 | Myo et al. |
| 2008/0063798 | A1 | 3/2008 | Kher et al. |
| 2009/0191338 | A1 * | 7/2009 | Matsumoto et al. ...... 427/255.28 |
| 2009/0203222 | A1 * | 8/2009 | Dussarrat et al. ............. 438/778 |
| 2010/0290945 | A1 * | 11/2010 | Ma et al. ....................... 420/422 |

FOREIGN PATENT DOCUMENTS

| | | |
|---|---|---|
| EP | 2 050 767 | 4/2009 |
| JP | 2002 093804 | 3/2002 |
| JP | 2005 209766 | 8/2005 |
| KR | 10 2007 0121281 | 12/2007 |
| KR | 10 2008 0050510 | 6/2008 |
| KR | 10 2009 0054559 | 6/2009 |
| WO | WO 2006 131751 | 12/2006 |
| WO | WO 2007 066546 | 6/2007 |
| WO | WO 2007 140813 | 12/2007 |
| WO | WO 2007 141059 | 12/2007 |

OTHER PUBLICATIONS

Aarik, J. et al., "Effects of precursors on nucleation in atomic layer deposition of $HfO_2$." Applied Surface Science 230 (2004), pp. 292-300.
Besancon, B. et al., "Comparison of $HfSiO_2$ thin film deposited by ALD with moisture using different silicon sources," Abstract #1546, 218$^{th}$ ECS Meeting, The Electrochemical Society 2010, 1 pg.
Hausmann, D.M. et al., "Atomic layer deposition of hafnium and zirconium oxide using metal amide precursors," Chem., Mater. 2002, 14, 4350-4353.
Kawahara, T. et al., "Effect of Hf source, oxidizing agents. and $NH_3$/Ar plasma on the properties of $HfAlO_x$ films prepared by atomic layer deposition." J. Appl. Phys., vol. 43, No. 7A, pp. 4129-4134.
Niinisto, J. et al., "Novel mixed alkylamido-cyclopentadienyl precursors for ALD of $ZrO_2$ thin films," Journal of Materials Chemistry 2008, 18, pp. 5243-5247.
Rushworth, S. et al., "Thermal stability studies for advanced hafnium and zirconium ALD precursors," Surface & Coatings Technology 201 (2007). pp. 9060-9065.
Senzaki, Y. et al., "Atomic layer deposition of hafnium oxide and hafnium silicate thin films using liquid precursors and ozone," J. Vac. Sci. Technol. A 22(4), Jul./Aug. 2004.
International Search Report and Written Opinion for corresponding PCT/US2010/055693, May 18, 2011.

* cited by examiner

*Primary Examiner* — Bret Chen
(74) *Attorney, Agent, or Firm* — Patricia E. McQueeney

(57) ABSTRACT

Disclosed are hafnium- or zirconium-containing compounds. The compounds may be used to deposit hafnium- or zirconium-containing layers using vapor deposition methods such as chemical vapor deposition or atomic layer deposition. The hafnium- or zirconium-containing compounds include a ligand at least one aliphatic group as substituents selected to have greater degrees of freedom than the substituents disclosed in the prior art.

20 Claims, 3 Drawing Sheets

TGA of HfCl₃(nPrCp): Full evaporation at ~275°C with no residue

TGA of HfCl$_3$(nBuCp): Full evaporation at ~280°C with no residue

TGA of HfCl₃(tBuCp): Full evaporation at ~250°C with no residue

METHODS OF MAKING AND DEPOSITION METHODS USING HAFNIUM- OR ZIRCONIUM-CONTAINING COMPOUNDS

CROSS REFERENCE TO RELATED APPLICATIONS

This application is a 371 of International PCT Application PCT/US2010/055693, filed Nov. 5, 2010, which claims priority to U.S. Provisional Application No. 61/259,433, filed Nov. 9, 2009, the entire contents of each being incorporated herein by reference.

TECHNICAL FIELD

Disclosed are hafnium- or zirconium-containing compounds that may be used to deposit hafnium- or zirconium-containing layers using vapor deposition methods

BACKGROUND

Silicon dioxide ($SiO_2$) was a reliable dielectric at the beginning of the semiconductor industry. As devices have continued to shrink and the technology has moved from "Full Si" transistor to "Metal Gate/High-k" in the case of transistors, the reliability of the $SiO_2$-based gate dielectric is reaching its physical limits. One solution is to use other materials, such as hafnium-based or zirconium-based metal oxides for gate dielectrics. High-k materials (so-called because of their high dielectric constant) are becoming a material of choice since they can be made much thicker than $SiO_2$ while achieving the same gate capacitance.

Singh et al. (US Pat. App. Pub. No. 2007/0259111A1) describes forming hafnium oxide films using chlorinated hafnium precursors such as $HfCl_2(^tBuCp)_2$, $HfCl_2Cp_2$, $HfCl_2(EtCp)_2$, $HfCl_2(MeCp)_2$, $HfCl_3(Me_5Cp)$, $HfCl_2(^iPrCp)_2$ and $HfCl_3(^iPrCp)$.

Itsuki et al. (JP200509766A) describes the use of $HfCl_3Cp$ for deposition of Hf-containing films by MOCVD; respectively Kim et al. (KR2007121281A) described the synthesis method or $ZrCl_3Cp$ as a precursor for deposition methods.

Other sources and methods of incorporating such materials are being sought for new generations of integrated circuit devices.

NOTATION AND NOMENCLATURE

Certain abbreviations, symbols, and terms are used throughout the following description and claims and include: the term "rare earth metals" or "RE" refers to scandium (Sc), Yttrium (Y), and the lanthanide series (not including radioactive promethium (Pm)); the acronym "THF" refers to tetrahydrofuran; the term "aliphatic group" refers to saturated or non-saturated functional groups that contain carbon, such as alkanes, alkenes, or alkynes; the term "alkanes" or "alkyl group" refers to saturated functional groups containing exclusively carbon and hydrogen atoms. Further, the term "aliphatic group" refers to linear, branched, or cyclic alkyl groups. Examples of linear alkyl groups include without limitation, methyl groups, ethyl groups, propyl groups, butyl groups, etc. Examples of branched alkyl groups include without limitation, t-butyl. Examples of cyclic alkyl groups include without limitation, cyclopropyl groups, cyclobutyl groups, cyclopentyl groups, cyclohexyl groups, etc.

The abbreviation "Me" refers to a methyl group; the abbreviation "Et" refers to an ethyl group; the abbreviation "Pr" refers to a propyl group; the abbreviation "nPr" refers to a chain propyl group; the abbreviation "iPr" refers to an iso-propyl group; the abbreviation "Bu" refers to a butyl (n-butyl) group; the abbreviation "tBu" refers to a tert-butyl group; the abbreviation "sBu" refers to a sec-butyl group; the abbreviation "iBu" refers to an iso-butyl group.

The standard abbreviations of the elements from the periodic table of elements are used herein. It should be understood that elements may be referred to by these abbreviations (e.g., Hf refers to hafnium, Zr refers to zirconium, etc).

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

SUMMARY

Disclosed are methods of forming a metal-containing layer on a substrate. A reaction chamber having at least one substrate is provided. A vapor is introduced into the reaction chamber, the vapor comprising at least one compound having the formula $MCl_3(R_1R_2R_3R_4R_5Cp)$, wherein $R_1$ to $R_5$ is independently H or an aliphatic group having 1 to 6 carbon atoms, provided that at least $R_1$ is an aliphatic group having 1 to 6 carbon atoms; Cp being a cyclopentadienyl; M is Hf or Zr; provided that when $R_1$ through $R_5$ is Me (Me=$CH_3$) or $R_1$ is $^iPr$ ($^iPr$=$CH_3CHCH_3$) and $R_2$ through $R_5$ is H, M is not Hf. The vapor is contacted with the substrate to form a metal-containing layer on at least one surface of the substrate using a vapor deposition process. The method may further include one or more of the following aspects:

the at least one compound being selected from the group consisting of $HfCl_3(''PrCp)$, $HfCl_3(^iBuCp)$, $HfCl_3(''BuCp)$, $HfCl_3(^tBuCp)$, $ZrCl_3(''PrCp)$, $ZrCl_3(^iBuCp)$, $ZrCl_3(Me_5Cp)$, $ZrCl_3(^iPrCp)$, $ZrCl_3(''BuCp)$, and $ZrCl_3(^tBuCp)$, wherein $nPr$=$CH_3CH_2CH_2$, $iBu$=$(CH_3)_2CHCH_2$, $nBu$=$CH_3(CH_2)_3$;

the at least one compound being $HfCl_3(nBuCp)$ or $HfCl_3(tBuCp)$;

introducing into the reaction chamber a vapor of a second precursor and directing the vapor to the substrate;

the second precursor comprising a metal selected from the group consisting of Ti, Ta, Bi, Hf, Zr, Pb, Nb, Mg, Al, Sr, Y, lanthanides, and combinations thereof;

introducing into the reaction chamber at least one reaction gas;

the at least one reaction gas being selected from the group consisting of $O_2$, $H_2O$, $O_3$, $H_2O_2$, carboxylic acid, and combinations thereof;

the vapor deposition process being a chemical vapor deposition process;

the vapor deposition process being an atomic layer deposition process comprising a plurality of deposition cycles; and the metal-containing layer being selected from the group consisting of $HfO_2$, $ZrO_2$, $(Hf,Zr)O_x$, $HfSiO_x$, $HfSiON$, $HfO_xN_y$, $HfLa_xO_y$, $HfAl_xO_y$, $ZrAl_xO_y$, $ZrSi_xO_y$, $ZrSiON$, $ZrO_xN_y$, $ZrLa_xO_y$, $Pb(Zr,Ti)O_3$, $HfY_xO_y$, $ZrY_xO_y$, $HfRE_xO_y$, and $ZrRE_xO_y$; wherein x and y are relative numbers ranging from greater than 0, such as 0.01 or 0.1, to 5.

BRIEF DESCRIPTION OF THE DRAWINGS

For a further understanding of the nature and objects of the present invention, reference should be made to the following detailed description, taken in conjunction with the accompanying graphs, and wherein.

DETAILED DESCRIPTION

Figure 1:
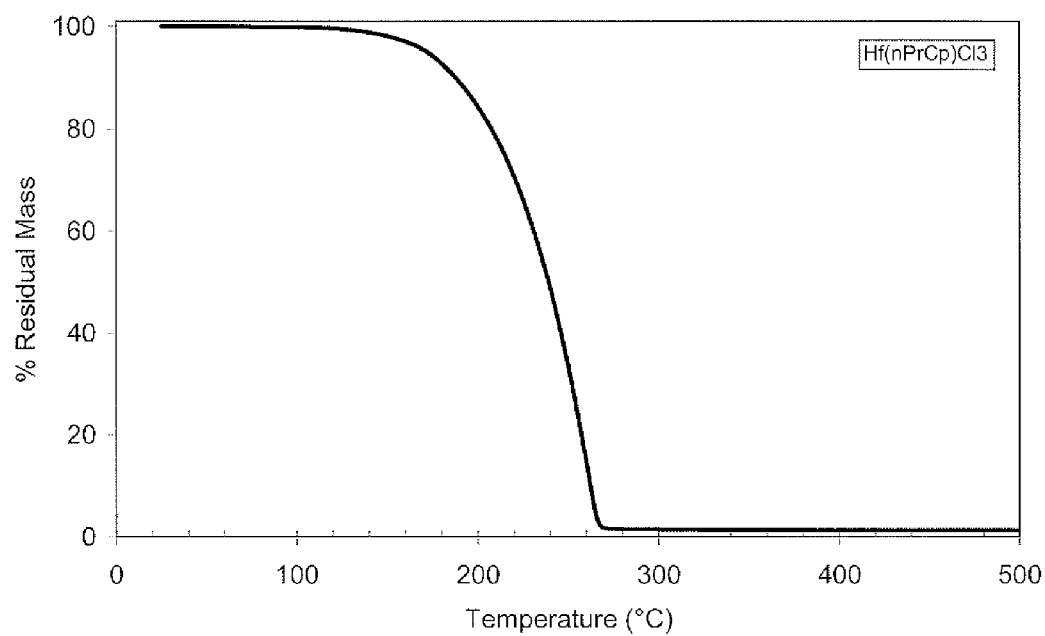
FIG. 1 is a thermogravimetric analysis (TGA) graph of $HfCl_3(^nPrCp)$.

Disclosed are hafnium- or zirconium-containing compounds (i.e., hafnium- or zirconium-containing complexes, precursors). Such compounds have the formula $MCl_3(R_1R_2R_3R_4R_5Cp)$, wherein $R_1$ to $R_5$ is independently H or an aliphatic group having 1 to 6 carbon atoms, provided that at least $R_1$ is an aliphatic group having 1 to 6 carbon atoms; Cp being a cyclopentadienyl; M is Hf or Zr; provided that when $R_1$ through $R_5$ is Me or $R_1$ is $^iPr$ and $R_2$ through $R_5$ is H, M is not Hf. The compounds may be used as precursors in atomic layer deposition of a hafnium- or zirconium-containing film. The best precursor will be selected for its low carbon content and high reactivity toward the surface. Physical properties such as vapor pressure and melting point are also considered for better and more accurate delivery.

One preferred embodiment is the use of $(R_1R_2R_3R_4R_5Cp)=(Me_5Cp)$. Other embodiments include but are not limited to $HfCl_3(^nPrCp)$, $HfCl_3(^iBuCp)$, $HfCl_3(^nBuCp)$, $HfCl_3(^tBuCp)$, $HfCl_3(^tBu_3Cp)$, $HfCl_3(^iPr_3Cp)$, $ZrCl_3(^nPrCp)$, $ZrCl_3(^iBuCp)$, $ZrCl_3(Me_5Cp)$, $ZrCl_3(^iPrCp)$, $ZrCl_3(^nBuCp)$, $ZrCl_3(^tBuCp)$, $ZrCl_3(^tBu_3Cp)$, and $ZrCl_3(^iPr_3Cp)$.

In one embodiment, the melting points of the hafnium-containing compounds range from approximately 60° C. to approximately 100° C., and more preferably from approximately 60° C. to approximately 75° C. Utilization of hafnium-containing precursors having these melting points provides for easier and more uniform delivery of the precursor to the reaction chamber. Additionally, condensation and/or clogging of the precursor on the delivery lines is avoided.

In an alternate embodiment, when any of $R_1$ to $R_5$ is an aliphatic group having 3 to 6 carbon atoms, the aliphatic group is linear as opposed to branched. For example, $R_1$ to $R_5$ may preferably be selected from n-propyl, n-butyl, n-pentyl, or n-hexyl. Applicants believe that the use of linear aliphatic groups may result in less carbon incorporation into the resulting hafnium- or zirconium-containing layer. Layers having higher carbon incorporation experience greater current leakage. The use of linear alkyl groups may provide less current leakage.

The disclosed hafnium- or zirconium-containing compounds may be prepared by addition of a solution of $(R_1R_2R_3R_4R_5Cp)Na$ or $(R_1R_2R_3R_4R_5Cp)Li$ in a polar solvent, such as THF, or a nonpolar solvent, such as toluene, to a solution of $MCl_4$ in the same solvent, with the starting materials having the same definitions provided above (i.e. M=Hf or Zr, etc.). The resulting mixture is then stirred at room temperature overnight. The mixture is filtered and solvent evaporated under vacuum to produce the crude $M(R_1R_2R_3R_4R_5Cp)Cl_3$ product, which may be purified by known methods. All of the starting materials, except $(R_1R_2R_3R_4R_5Cp)Na$ or $(R_1R_2R_3R_4R_5Cp)Li$, are commercially available. The synthesis methods for $(R_1R_2R_3R_4R_5Cp)Na$ or $(R_1R_2R_3R_4R_5Cp)Li$ are well known.

Also disclosed is the method of using hafnium- or zirconium-containing compounds having the formula above and suitable properties for vapor deposition methods. Such properties include a high vapor pressure, a low melting point (and preferably a liquid), a lower sublimation point, and a high thermal stability.

Applicants discovered that a substituted cyclopentadienyl ligand attached to a chlorinated hafnium or zirconium precursor may ultimately be a good compromise. The presence of the chlorine ligand helps to keep the high reactivity toward the surface, whereas the substituted cyclopentadienyl allows a tuning of the physical properties such as volatility and physical state.

Applicants propose that having at least one substituted cyclopentadienyl ligand may maximize the reactivity of the chlorinated precursor, greatly improve the vapor pressure, and lower the melting point of the compound.

Figure 2:
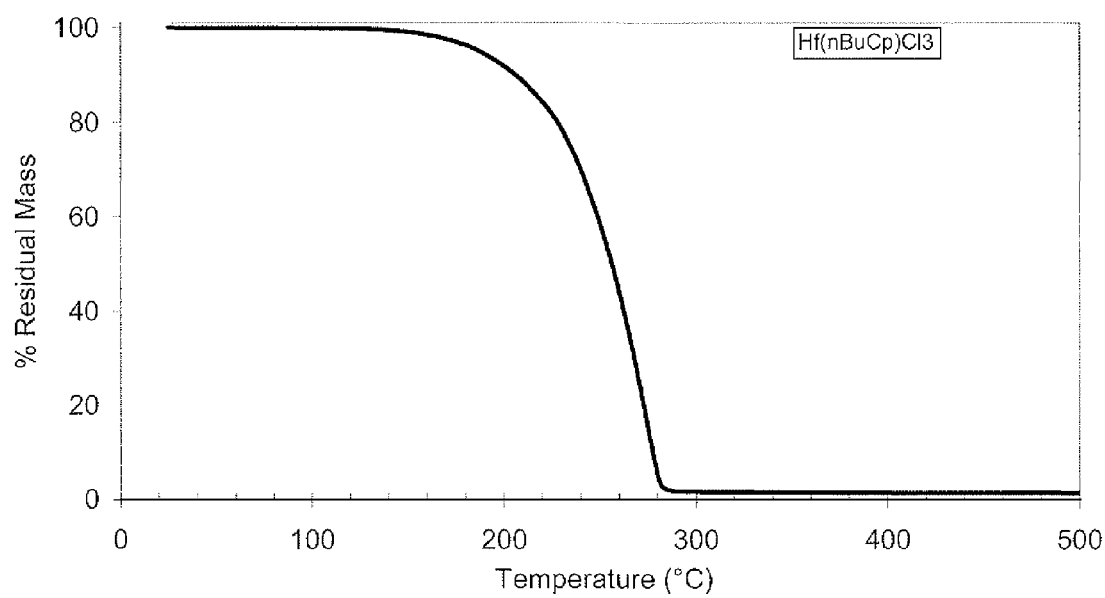
FIG. 2 is a TGA graph of $HfCl_3(^nBuCp)$.
Figure 3:
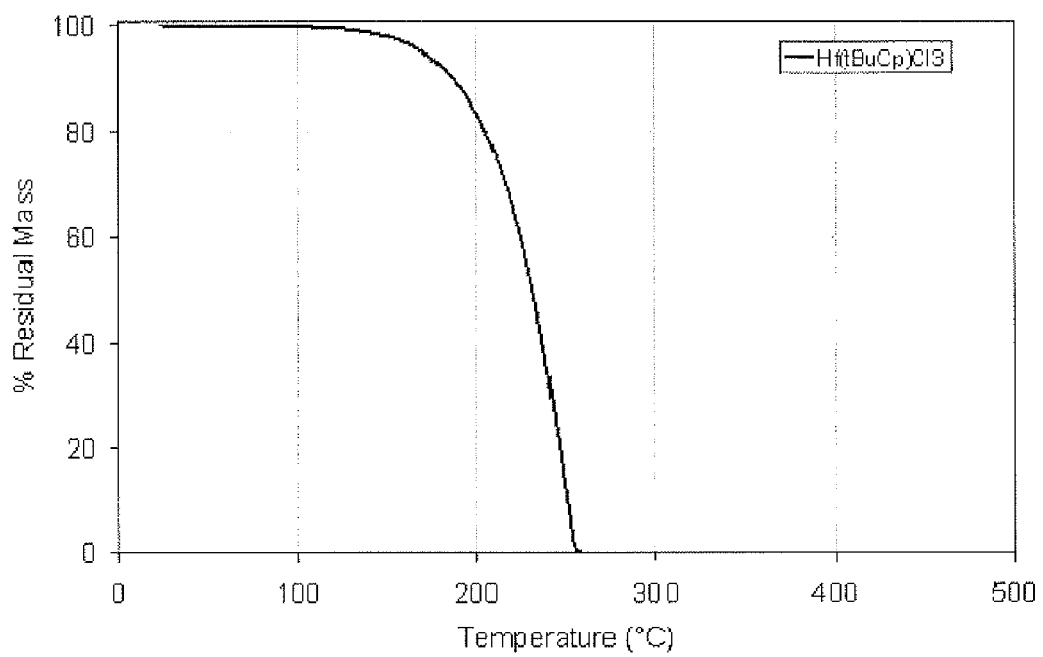
FIG. 3 is a TGA graph of $HfCl_3(^tBuCp)$.

For instance, FIGS. 1, 2, and 3 show the promising thermal stability of $HfCl_3(^nPrCp)$, $HfCl_3(^nBuCp)$, and $HfCl_3(^tBuCp)$. All compounds demonstrate a full evaporation with no remaining residues.

Also disclosed is the method of forming a hafnium- or zirconium-containing layer on a substrate (e.g., a semiconductor substrate or substrate assembly) using a vapor deposition process. The method may be useful in the manufacture of semiconductor, photovoltaic, LCD-TFT, or flat panel type devices. The method includes: providing a substrate; providing a vapor including at least one compound of the formula above and contacting the vapor with the substrate (and typically directing the vapor to the substrate) to form a hafnium- or zirconium-containing layer on at least one surface of the substrate.

The disclosed precursor compounds (hereinafter the "precursors") may be deposited to form hafnium-containing films or zirconium-containing films (collectively "films") using any deposition methods known to those of skill in the art. Examples of suitable deposition methods include without limitation, conventional chemical vapor deposition (CVD), low pressure chemical vapor deposition (LPCVD), atomic layer deposition (ALD), pulsed chemical vapor deposition (P-CVD), plasma enhanced atomic layer deposition (PE-ALD), or combinations thereof.

The type of substrate upon which the film will be deposited will vary depending on the final use intended. In some embodiments, the substrate may be chosen from oxides which are used as dielectric materials in Metal Insulator Metal (MIM—a structure used in capacitors), dynamic random access memory (DRAM), ferroelectric random access memory (FeRam technologies or gate dielectrics in complementary metal-oxide-semiconductor (CMOS) technologies (for example, $HfO_2$ based materials, $TiO_2$ based materials, $ZrO_2$ based materials, rare earth oxide based materials, ternary oxide based materials, etc.) or from nitride-based films (for example, TaN) that are used as an oxygen barrier between copper and the low-k layer. Other substrates may be used in the manufacture of semiconductors, photovoltaics, LCD-TFT, or flat panel devices. Examples of such substrates include, but are not limited to, solid substrates such as metal substrates (for example, Au, Pd, Rh, Ru, W, Al, Ni, Ti, Co, Pt and metal silicides, such as $TiSi_2$, $CoSi_2$, $NiSi$, and $NiSi_2$); metal nitride containing substrates (for example, TaN, TiN, WN, TaCN, TiCN, TaSiN, and TiSiN); semiconductor materials (for example, Si, SiGe, GaAs, InP, diamond, GaN, and SiC); insulators (for example, $SiO_2$, $Si_3N_4$, SiON, $HfO_2$, $Ta_2O_5$, $ZrO_2$, $TiO_2$, $Al_2O_3$, and barium strontium titanate); or other substrates that include any number of combinations of these materials. The actual substrate utilized may also depend upon the specific precursor embodiment utilized. In many instances though, the preferred substrate utilized will be selected from TiN, Ru, and Si type substrates.

The precursor is introduced as a vapor into a reaction chamber containing at least one substrate. The reaction chamber may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems.

The reaction chamber may be maintained at a pressure ranging from about $10^{-3}$ Torr (0.13332 Pa) to about 760 Torr (101,325 Pa), preferably from about $10^{-3}$ Torr (0.13332 Pa) to about 10 Torr (1333 Pa). In addition, the temperature within the reaction chamber may range from about 150° C. to about 600° C. One of ordinary skill in the art will recognize that the temperature may be optimized through mere experimentation to achieve the desired result.

The substrate may be heated to a sufficient temperature to obtain the desired film at a sufficient growth rate and with desired physical state and composition. A non-limiting exemplary temperature range to which the substrate may be heated includes from about 150° C. to about 900° C. Preferably, the temperature of the substrate is between about 150° C. and about 550° C.

The precursor may be fed in liquid state to a vaporizer where it is vaporized before it is introduced into the reaction chamber. Prior to its vaporization, the precursor may optionally be mixed with one or more solvents, one or more metal sources, and a mixture of one or more solvents and one or more metal sources. The solvents may be selected from the group consisting of toluene, ethyl benzene, xylene, mesitylene, decane, dodecane, octane, hexane, pentane, or others. The resulting concentration may range from approximately 0.05 M to approximately 2 M. The metal source may include any metal precursors now known or later developed.

Alternatively, the precursor may be vaporized by passing a carrier gas into a container containing the precursor or by bubbling the carrier gas into the precursor. The carrier gas and precursor are then introduced into the reaction chamber. If necessary, the container may be heated to a temperature that permits the precursor to be in its liquid phase and to have a sufficient vapor pressure. The carrier gas may include, but is not limited to, Ar, He, $N_2$, and mixtures thereof. The precursor may optionally be mixed in the container with a solvent, another metal precursor, or a mixture thereof. The container may be maintained at temperatures in the range of, for example, 0-150° C. Those skilled in the art recognize that the temperature of the container may be adjusted in a known manner to control the amount of precursor vaporized.

The temperature and the pressure within the reactor are held at conditions suitable for ALD or CVD depositions. In other words, the previously disclosed conditions within the chamber are such that the vapor introduced into the reaction chamber is contacted with the substrate to form a metal-containing layer on the substrate.

In addition to the optional mixing of the precursor with solvents, metal precursors, and stabilizers prior to introduction into the reaction chamber, the precursor may be mixed with reactant species inside the reaction chamber. Exemplary reactant species include, without limitation, $H_2$, metal precursors such as trimethyl aluminum (TMA) or other aluminum-containing precursors, other silicon-containing precursors, tertiary butylimido tris(diethylamino) tantalum (Ta[N($C_2H_5$)$_2$]$_3$[NC(CH$_3$)$_3$] or TBTDET), tantalum tetraethoxide dimethylaminoethoxide (TAT-DMAE), pentaethoxy tantalum (PET), tertiary butylimido tris(diethylamino) niobium (TBTDEN), pentaethoxy niobium (PEN), and any combination thereof.

When the desired film also contains oxygen, such as, for example and without limitation, hafnium oxide, the reactant species may include an oxygen source which is selected from, but not limited to, $O_2$, $O_3$, $H_2O$, $H_2O_2$, acetic acid, formalin, para-formaldehyde, and combinations thereof. Alternatively, the oxygen source may be selected from $O_2$, $H_2O$, $O_3$, $H_2O_2$, carboxylic acid, or combinations thereof.

When the desired film also contains nitrogen, such as, for example and without limitation, ZrSiON or $HfO_xN_y$, the reactant species may include a nitrogen source which is selected from, but not limited to, nitrogen ($N_2$), ammonia and alkyl derivatives thereof, hydrazine and alkyl derivatives thereof, N-containing radicals (for instance $N^-$, $NH^-$, $NH_2^-$), NO, $N_2O$, $NO_2$, amines, and any combination thereof.

When the desired film also contains carbon, such as, for example and without limitation, zirconium carbide or hafnium carbo-nitride, the reactant species may include a carbon source which is selected from, but not limited to, methane, ethane, propane, butane, ethylene, propylene, t-butylene, isobutylene, $CCl_4$, and any combination thereof.

When the desired film also contains silicon, such as, for example and without limitation, $HfSiO_x$ or ZnSiON, the reactant species may include a silicon source which is selected from, but not limited to, $SiH_4$, $Si_2H_6$, $Si_3H_8$, tris(dimethylamino) silane (TriDMAS), bis(dimethylamino) silane (BDMAS), bis(diethylamino) silane (BDEAS), tetrakis-diethylamino silane (TDEAS), tris(dimethylamino) silane (TDMAS), tetrakis-ethylmethylamino silane (TEMAS), $(SiH_3)_3N$, $(SiH_3)_2O$, trisilylamine, disiloxane, trisilylamine, disilane, trisilane, an alkoxysilane $SiH_x(OR^1)_{4-x}$, a silanol $Si(OH)_x(OR^1)_{4-x}$ (preferably $Si(OH)(OR^1)_3$; more preferably $Si(OH)(OtBu)_3$ an aminosilane $SiH_x(NR^1R^2)_{4-x}$ (where x is 1, 2, 3, or 4; $R^1$ and $R^2$ are independently H or a linear, branched or cyclic C1-C6 carbon chain; preferably TriDMAS, BTBAS, and/or BDEAS), and any combination thereof. The targeted film may alternatively contain germanium (Ge), in which case the above-mentioned Si-containing reactant species could be replaced by Ge-containing reactant species.

When the desired film also contains another metal, such as, for example and without limitation, Ti, Ta, Hf, Zr, Nb, Mg, Al, Sr, Y, Ba, Ca, As, Sb, Bi, Sn, Pb, or combinations thereof, the reactant species may include a second precursor which is selected from, but not limited to, metal alkyls such as $SbR^{i'}_3$ or $SnR^{i'}_4$ (wherein each R is independently H or a linear, branched, or cyclic C1-C6 carbon chain), metal alkoxides such as $Sb(OR^i)_3$ or $Sn(OR^i)_4$ (where each $R^i$ is independently H or a linear, branched, or cyclic C1-C6 carbon chain), and metal amines such as $Sb(NR^1R^2)(NR^3R^4)(NR^5R^6)$ or $Ge(NR^1R^2)(NR^3R^4)(NR^5R^6)(NR^7R^8)$ (where each $R^1$, $R^2$, $R^3$, $R^4$, $R^5$, $R^6$, $R^7$, and $R^8$ is independently H, a C1-C6 carbon chain, or a trialkylsilyl group, the carbon chain and trialkylsilyl group each being linear, branched, or cyclic), and any combination thereof.

The precursor and one or more reactant species may be introduced into the reaction chamber simultaneously (chemical vapor deposition), sequentially (atomic layer deposition), or in other combinations. For example, the precursor may be introduced in one pulse and two additional metal sources may be introduced together in a separate pulse [modified atomic layer deposition]. Alternatively, the reaction chamber may already contain the reactant species prior to introduction of the precursor. The reactant species may be passed through a plasma system localized remotely from the reaction chamber, and decomposed to radicals. Alternatively, the precursor may be introduced to the reaction chamber continuously while other metal sources are introduced by pulse (pulsed-chemical vapor deposition). In each example, a pulse may be followed by a purge or evacuation step to remove excess amounts of the component introduced. In each example, the pulse may last for a time period ranging from about 0.01 s to about 10 s, alternatively from about 0.3 s to about 3 s, alternatively from about 0.5 s to about 2 s.

In an ALD or PEALD process, an annealing or flash annealing step may be performed between each ALD cycle or, preferably, after multiple ALD cycles (for instance every 2 to 10 ALD cycles). The number of deposition cycles performed between each annealing step may be tuned to maximize film properties and throughput. The substrate may be exposed to a temperature ranging from approximately 400° C. and approximately 1000° C. for a time ranging from approximately 0.1 second to approximately 120 seconds under an inert, a N-containing atmosphere, an O-containing atmosphere, or combinations thereof. The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus.

In one non-limiting exemplary atomic layer deposition type process, the vapor phase of the hafnium- or zirconium-containing precursor is introduced into the reaction chamber, where it is contacted with a suitable substrate. Excess precursor may then be removed from the reaction chamber by purging and/or evacuating the reaction chamber. A nitrogen source is introduced into the reaction chamber where it reacts with the absorbed precursor in a self-limiting manner. Any excess nitrogen source is removed from the reaction chamber by purging and/or evacuating the reaction chamber. If the desired film is a hafnium or zirconium nitride film, this two-step process may provide the desired film thickness or may be repeated until a film having the necessary thickness has been obtained.

Alternatively, if the desired film is a hafnium or zirconium metal nitride film, the two-step process above may be followed by introduction of the vapor of a second precursor into the reaction chamber. The second precursor will be selected based on the nature of the hafnium or zirconium metal nitride film being deposited and may include a carbon-containing precursor. After introduction into the reaction chamber, the second precursor is contacted with the substrate. Any excess second precursor is removed from the reaction chamber by purging and/or evacuating the reaction chamber. Once again, a nitrogen source may be introduced into the reaction chamber to react with the second precursor. Excess nitrogen source is removed from the reaction chamber by purging and/or evacuating the reaction chamber. If a desired film thickness has been achieved, the process may be terminated. However, if a thicker film is desired, the entire four-step process may be repeated. By alternating the provision of the precursor, second precursor, and nitrogen source, a film of desired composition and thickness can be deposited.

The hafnium-containing or zirconium-containing films or layers resulting from the processes discussed above may include $HfO_2$, $ZrO_2$, $(Hf,Zr)O_x$, $HfSiO_x$, HfSiON, $HfO_xN_y$, $HfLa_xO_y$, $HfAl_xO_y$, $ZrAl_xO_y$, $ZrSi_xO_y$, ZrSiON, $ZrO_xN_y$, $ZrLa_xO_y$, $Pb(Zr,Ti)O_3$, $HfY_xO_y$, $ZrY_xO_y$, $HfRE_xO_y$, and $ZrRE_xO_y$, wherein x and y are numbers >0, and RE=rare earth metal. One of ordinary skill in the art will recognize that by judicial selection of the appropriate precursor and reactant species, the desired film composition may be obtained.

EXAMPLES

The following examples illustrate experiments performed in conjunction with the disclosure herein. The examples are not intended to be all inclusive and are not intended to limit the scope of disclosure described herein.

Example 1

Hf(EtCp)Cl$_3$ Synthesis: 3.00 g (9.37 mmol) of solid HfCl$_4$ was slowly added to a 250 mL Schienk flask containing THF solvent. The solid dissolved immediately resulting in clear solution. A solution of EtCpNa (4.21 mL, 9.37 mmol, 2.18N) in THF was added via syringe. The resulting mixture was stirred overnight. Solvent and volatiles were evaporated and resulting sticky solid was extracted with toluene, filtered through Celite and dried. Obtained quantitative yield.

Example 2

NMR spectra for Hf(nPrCp)Cl$_3$ and Hf(nBuCp)Cl$_3$ and are as follows:

Hf(nPrCp)Cl$_3$: $^1$H NMR($C_6D_6$, d): 0.64 (t, 3H, $C_5H_4$—CH$_2$CH$_2$CH$_3$); 1.20 (h, 2H, $C_5H_4$—CH$_2$CH$_2$CH$_3$); 2.32 (t, 2H, $C_5H_4$—CH$_2$CH$_2$CH$_3$); 5.76, 5.81 (s, 2H×2, $C_5H_4$—CH$_2$CH$_2$CH$_3$)

Hf(nBuCp)Cl$_3$: $^1$H NMR($C_6D_6$, d): 0.75 (t, 3H, $C_5H_4$—CH$_2$CH$_2$CH$_2$CH$_3$); 1.03 (h, 2H, $C_5H_4$—CH$_2$CH$_2$CH$_2$CH$_3$); 1.20 (h, 2H, $C_5H_4$—CH$_2$CH$_2$CH$_2$CH$_3$); 2.38 (t, 2H, $C_5H_4$—CH$_2$CH$_2$CH$_2$CH$_3$); 5.78, 5.81 (s, 2H×2, $C_5H_4$—CH$_2$CH$_2$CH$_2$CH$_3$)

Example 3

The melting points of various hafnium-containing compounds were determined and are provided in Table 1:

| Compound | Melting Point (° C.) |
|---|---|
| HfCl$_4$ | 320 |
| HfCl$_3$(Me$_5$Cp) | 180 |
| HfCl$_3$(iBuCp) | 96 |
| HfCl$_3$(nPrCp) | 85 |
| HfCl$_3$(iPrCp) | 82 |
| HfCl$_3$(nBuCp) | 73 |
| HfCl$_3$(tBuCp) | 68 |

Example 4

HfCl$_3$("PrCp) was used to deposit pure HfO$_2$ films on silicon wafer using moisture as co-reactant using an atomic layer deposition technique. Deposition rates as high as 0.4 A/cycle (0.04 nm/cycle) were obtained at 300° C. with a refractive index RI=2.

The pressure in the reaction chamber was constant at 0.5 Torr (67 Pa). The bubbler temperature was maintained at 120° C. and a pressure of 22 Torr (2933 Pa). The flow rate of a nitrogen carrier gas was fixed at 50 sccm.

A few seconds of precursor introduction were necessary to obtain full surface saturation.

Example 5

The ALD saturation curve for HfCl$_3$("PrCp) was performed at 250° C. H$_2$O was introduced into the reaction chamber for 2 seconds followed by a 10 second purge. Saturation occurred for pulses of HfCl$_3$($n$PrCp) lasting 30 seconds followed by a 5 second nitrogen purge. The saturation deposition rate was 0.4 A/cycle (0.04 nm/cycle).

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

The invention claimed is:

1. A method of forming a metal-containing layer on a substrate, the method comprising:
  a) providing a reaction chamber having at least one substrate disposed therein;
  b) introducing into the reaction chamber a vapor comprising at least one compound selected from the group consisting of HfCl$_3$(nPrCp), HfCl$_3$(iBuCp), HfCl$_3$(tBuCp), ZrCl$_3$(nPrCp), ZrCl$_3$(iBuCp), ZrCl$_3$(iPrCp), and ZrCl$_3$(tBuCp); and
  c) contacting the vapor with the substrate to form a metal-containing layer on at least one surface of the substrate using a vapor deposition process.

2. The method of claim 1, wherein the at least one compound is selected from the group consisting of HfCl$_3$(nPrCp), HfCl$_3$(tBuCp), ZrCl$_3$(nPrCp), and ZrCl$_3$(tBuCp).

3. The method of claim 1, wherein the at least one compound is HfCl$_3$(tBuCp).

4. The method of claim 3, further comprising introducing into the reaction chamber at least one reaction gas, wherein the reaction gas is H$_2$O.

5. The method of claim 3, wherein the vapor deposition process is an atomic layer deposition process.

6. The method of claim 1, further comprising introducing into the reaction chamber a vapor of a second precursor and directing the vapor to the substrate.

7. The method of claim 6, wherein the second precursor comprises a metal selected from the group consisting of Ti, Ta, Bi, Hf, Zr, Pb, Nb, Mg, Al, Sr, Y, lanthanides, and combinations thereof.

8. The method of claim 1, further comprising introducing into the reaction chamber at least one reaction gas.

9. The method of claim 8, wherein the at least one reaction gas is selected from the group consisting of O$_2$, H$_2$O, O$_3$, H$_2$O$_2$, carboxylic acid, and combinations thereof.

10. The method of claim 1, wherein the vapor deposition process is a chemical vapor deposition process.

11. The method of claim 1, wherein the vapor deposition process is an atomic layer deposition process comprising a plurality of deposition cycles.

12. The method of claim 1, wherein the metal-containing layer is selected from the group consisting of HfO$_2$, ZrO$_2$, (Hf,Zr)O$_x$, HfSiO$_x$, HfSiON, HfO$_x$N$_y$, HfLa$_x$O$_y$, HfAl$_x$O$_y$, ZrAl$_x$O$_y$, ZrSi$_x$O$_y$, ZrSiON, ZrO$_x$N$_y$, ZrLa$_x$O$_y$, Pb(Zr,Ti)O$_3$, HfY$_x$O$_y$, ZrY$_x$O$_y$, HfRE$_x$O$_y$, and ZrRE$_x$O$_y$; wherein x and y are relative numbers ranging from greater than 0 to 5.

13. The method of claim 1, wherein the at least one compound is HfCl$_3$(nPrCp).

14. The method of claim 13, further comprising introducing into the reaction chamber at least one reaction gas, wherein the reaction gas is H$_2$O.

15. The method of claim 13, wherein the vapor deposition process is an atomic layer deposition process.

16. The method of claim 1, wherein the at least one compound is ZrCl$_3$(nPrCp).

17. The method of claim 12, further comprising introducing into the reaction chamber at least one reaction gas, wherein the reaction gas is H$_2$O.

18. The method of claim 16, wherein the vapor deposition process is an atomic layer deposition process.

19. The method of claim 1, wherein the at least one compound is ZrCl$_3$(tBuCp).

20. The method of claim 19, further comprising introducing into the reaction chamber at least one reaction gas, wherein the reaction gas is H$_2$O.

* * * * *